United States Patent [19]

Yamaguchi et al.

[11] Patent Number: 5,160,856
[45] Date of Patent: Nov. 3, 1992

[54] REFERENCE VOLTAGE REGULATOR SEMICONDUCTOR INTEGRATED CIRCUIT

[75] Inventors: Atsuo Yamaguchi; Etsushi Takebayashi, both of Hyogo, Japan

[73] Assignee: Mitsubishi Denki Kabushiki Kaisha, Tokyo, Japan

[21] Appl. No.: 683,223

[22] Filed: Apr. 10, 1991

[30] Foreign Application Priority Data

Sep. 26, 1990 [JP] Japan .................. 2-256320

[51] Int. Cl.5 .................. H03K 1/14; H03K 1/04
[52] U.S. Cl. .................. 307/296.8; 307/303; 307/310
[58] Field of Search .................. 307/303, 296.8, 310

[56] References Cited

U.S. PATENT DOCUMENTS

| | | | |
|---|---|---|---|
| 3,899,693 | 8/1975 | Gaudreault | 307/296.8 |
| 4,298,811 | 11/1981 | Salters et al. | 307/296.8 |
| 4,442,398 | 4/1984 | Bertails et al. | 307/296.8 |
| 4,609,833 | 9/1986 | Guterman | 307/296.8 |
| 4,808,847 | 2/1989 | Van Kessel | 307/296.8 |

FOREIGN PATENT DOCUMENTS 0367578 10/1989 European Pat. Off. .
8101423 10/1981 PCT Int'l Appl. .

Primary Examiner—Edward P. Westin
Assistant Examiner—Richard Roseen
Attorney, Agent, or Firm—Townsend and Townsend

[57] ABSTRACT

A semiconductor integrated circuit for a CMOS microcomputer and others having an analog circuit, in which a gate voltage of a transistor for setting a bias current is generated by arranging a diode formed by two islands in a MOS structure and a transistor in series, so as to decrease also a temperature dependence characteristic of the analog circuit. Thereby, the fluctuation of the characteristic of the analog circuit can be restrained despite of fluctuation not only of a power-supply voltage but also of a temperature.

10 Claims, 2 Drawing Sheets

REFERENCE VOLTAGE REGULATOR

BACKGROUND OF THE INVENTION

1. Field of the Invention

The present invention relates to a semiconductor integrated circuit having an analog circuit such as, for example, microcomputers of non-contact IC card, and more particularly to a bias circuit (a constant current circuit) for generating a bias current to be flowed to the analog circuit.

2. Description of the Prior Art

FIG. 3 shows a schematic structure of a non-contact IC card. As shown in the Figure, a ROM 2a, a RAM 2b, a sending circuit 3 and a receiving circuit 4 are connected to a CPU 1, respectively. Those members construct a microcomputer 5. A data sending antenna 6 and a data receiving antenna 7 are connected to the sending circuit 3 and the receiving circuit 4 in the microcomputer 5, respectively. A battery 8 and an oscillator 9 are connected to the CPU 1, and the battery 8 is connected also to other sections. The whole IC card is sealed by a resin and the like in order to improve the tolerance for environment. The IC card is provided for sending-/receiving data to and from the outside by using an electric wave. An analog circuit is necessary in the receiving circuit 4 for processing a small voltage generated in the receiving antenna 7 when the electric wave is to be received, and a bias circuit is necessary in the analog circuit for generating a bias current to be flowed into it. Since the characteristic of the analog circuit changes dependent on the bias current to be flowed, it is desirable to prevent the bias current from fluctuating dependent on the fluctuations of the power-supply voltage and the temperature as much as possible.

Referring to FIG. 4, an example of a conventional bias circuit constructed in an IC having CMOS structure will be explained hereinafter. In this case, the bias circuit is constructed in such a way that the bias current changes least in relation with the change of the power-supply voltage caused by the battery and others. In the Figure, numerals 101 and 102 indicate n channel transistors connected with a gate and drain respectively, and are connected in series. The source of the n channel transistor 101 is grounded and the drain of the n channel transistor 102 is connected to a gate of a n channel transistor 103. The source of the n channel transistor 103 is grounded, and the drain is connected to a gate and drain of a p channel transistor 104 forming a current mirror circuit and to a gate of a p channel transistor 105. A drain of the p channel transistor 105 is connected to the n channel transistors 101, 102 connected in series. Also, a gate of the p channel transistor 104 is connected also to a gate of a p channel transistor 106. The p channel transistors 104, 106 also construct a current mirror circuit, and a drain of the p channel transistor 106 is connected to the analog circuit. The two n channel transistors 101 and 102 are connected in series because it will be a mere current mirror circuit which causes unsteadiness if only one n channel transistor is provided.

In the above mentioned construction, the voltage to be added to the gate of the n channel transistor 103 is decided by the sum of two transistors of the n channel transistors 101 and 102, and the drain current of the n channel transistor 103 is decided by the gate voltage and the transistor characteristic of the n channel transistor 103. The drain current of the n channel transistor 103 is fed back to the n channel transistors 101 and 102 through the current mirror circuit, and is supplied to the analog circuit as a bias current.

Thus, the fluctuation of the bias current can be restrained despite of the fluctuation of the power-supply voltage caused by the battery 8 and others, so that the fluctuation of the characteristic of the analog circuit can be restrained.

The conventional circuit is constructed as mentioned above, and there has been a problem as described below. That is, the gate voltage of the n channel transistor 103 will depend on the sum of the temperature characteristic $V_{TH}$ of the n channel transistor 101 and the temperature characteristic $V_{TH}$ of the n channel transistor 102. The drain current of the n channel transistor 103 will depend on the difference between the temperature characteristic $V_{TH}$ of the gate voltage of the n channel transistor 103 and the temperature characteristic $V_{TH}$ of the n channel transistor 103. Thus, the drain current of the n channel transistor 103 will depend on only one temperature characteristic $V_{TH}$ of the n channel transistor 101, for example.

The temperature dependence of the n channel transistor 101 is explained below. The drain current of the n channel transistor 101 is given as: $i_D = \frac{1}{2}\beta(V_{OS} - V_{TH})^2$. With the gate and drain connected, the voltage drop across the n channel transistor 101 $V_{DS}$ is equal to $V_{OS}$, thus $i_D = \frac{1}{2}\beta(V_{DS} - V_{TH})^2$, or $$v_{DS} = \sqrt{\frac{2i_D}{\beta}} + V_{TH}$$

where $V_{TH}$ is a negative value for an NMOS transistor. Thus, $$v_{DS} = \sqrt{\frac{2i_D}{\beta}} - |V_{TH}|$$

For every rise of 1° C. in temperature, the magnitude of $V_{TH}$ decreases by about 2.5 mV. Furthermore, $\beta$ also decreases when temperature increases and its effect is a dominant one. Thus, $V_{DS}$ of the n channel transistor 101 increases when temperature rises.

The relationship between the voltage and current for a MOS transistor and its temperature characteristic described above are well know and disclosed, for example on pages 309 and 311 of Sedra et al., *Microelectronic Circuits* (1982), which is hereby incorporated by reference.

In order to restrain the instability of characteristics of the analog circuit, a further decrease in the temperature characteristic or temperature dependence of the bias current in the analog circuit is necessary.

SUMMARY OF THE INVENTION

The object of the present invention, in view of the above mentioned problem, is to provide a semiconductor integrated circuit in which the fluctuation of the characteristic of an analog circuit can be restrained despite of the fluctuation of the temperature.

For this end, the semiconductor integrated circuit with MOS structure of the present invention having an analog circuit and a bias circuit generating a bias current to be flowed to said analog circuit, is constructed such that first and second islands in the MOS structure are used as a diode in said bias circuit, a first transistor which connects gate and drain and the diode are connected in series, a voltage generated by this serial circuit is applied to a gate of a second transistor for setting a current value, a constant current generated in the second transistor is fed back to the serial circuit of the diode and the first transistor through a current mirror circuit and is made to be a bias current to the analog circuit.

That is, in the semiconductor integrated circuit of the present invention, one first transistor and one diode are arranged in series in order to determine a gate voltage of the second transistor so as to decrease the temperature characteristic of the gate voltage. As a result, characteristics of the first transistor and the second transistor are counterbalanced so that the temperature characteristic at determining a drain current of the second transistor will be only the diode, and the temperature characteristic can be improved since the temperature characteristic of the diode is smaller than the transistor.

The above and other objects, features, and advantages of the invention will become more apparent from the following description when taken in conjunction with the accompanying drawings.

DESCRIPTION OF THE PREFERRED EMBODIMENT

An embodiment of the present invention will be explained hereinafter.

Figure 1:
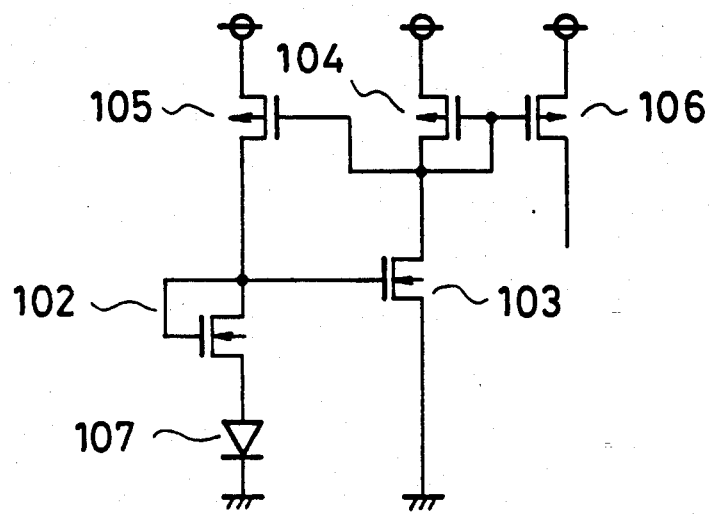
FIG. 1 is a circuit diagram showing a bias circuit in an embodiment of the present invention.
Figure 4:
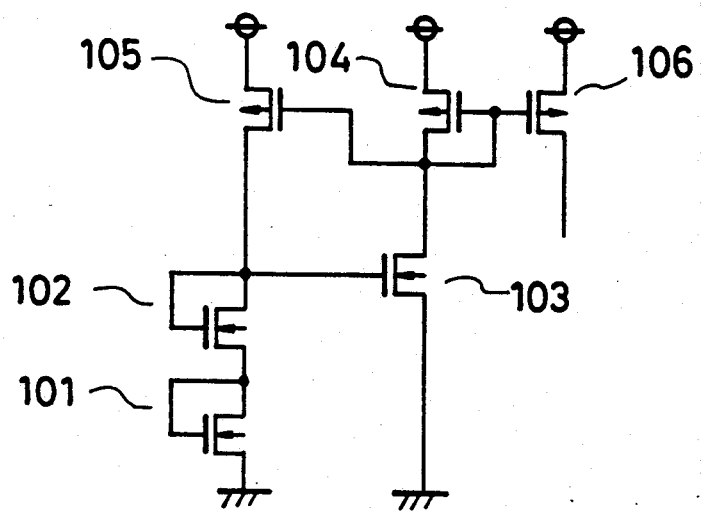
FIG. 4 is a circuit diagram showing a bias circuit in a conventional example.

FIG. 1 is a circuit diagram showing a bias circuit in the embodiment and numerals 102~106 are the same as a conventional example in said FIG. 4. In this circuit, a diode 107 is connected, instead of the n channel transistor 101 in the conventional example. An anode of the diode 107 is connected to a source of the n channel transistor 102 corresponding to a first transistor in the present invention, and a cathode is grounded. The n channel transistor 103 corresponds to a second transistor of the present invention, and the p channel transistors 104~106 construct a current mirror circuit in the present invention.

Figure 2:
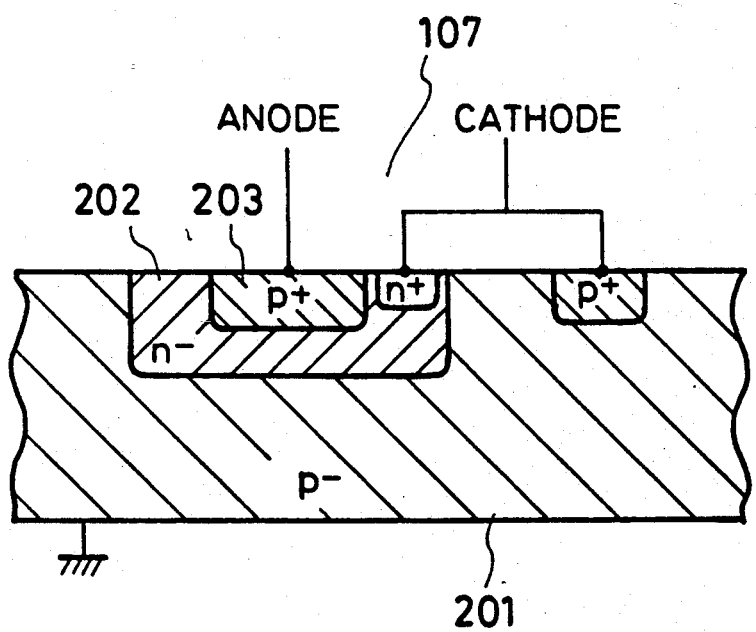
FIG. 2 is a schematic diagram showing a structure of a diode of said embodiment in an IC having CMOS structure.
Figure 3:
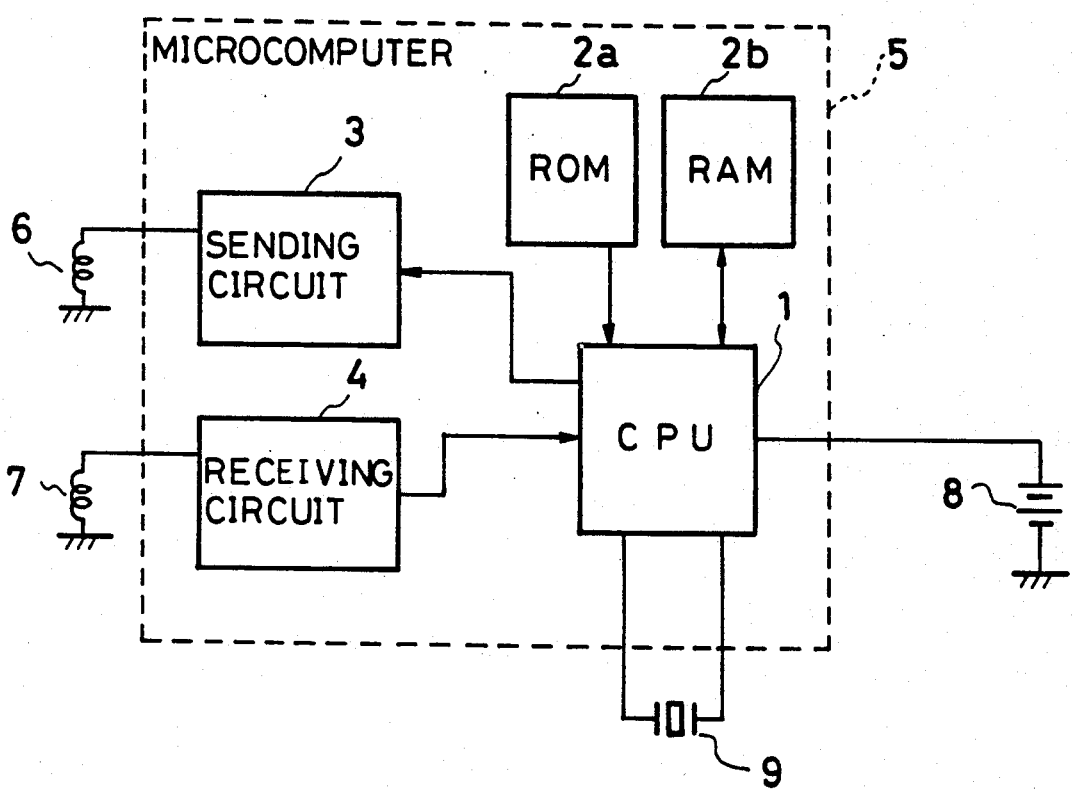
FIG. 3 is a block diagram of a non-contact IC card applied to the present invention.

The diode 107, as shown in FIG. 2, is constructed as follows in the IC having CMOS structure. In the CMOS structure, since making a transistor is easier structurally, a diode is rarely made fundamentally. Here, an example having a structure, where the substrate is p channel provided with n channel island, will be explained. In the first place, a substrate 201 of the p channel is on the grounded level structurally. A first island 202 of the n channel and a second island 203 of the p channel in the first island 202 forms the diode 107. The first island 202 becomes a cathode of the diode 107 and the second island 203 of the p channel becomes an anode.

That is, in the present embodiment, as shown in FIG. 2, the first island 202 of the n channel and the second island 203 of the p channel are used as the diode 107 in the IC having CMOS structure, and as shown in FIG. 1, the n channel transistor 102, which connects the gate and the drain, and the diode 107 are arranged in series. A voltage generated at a contact point of the serial circuit and the p channel transistor 105 is applied to the gate of the n channel transistor 103 which sets a current value. A constant current generated in the n channel transistor 103 is fed back to the serial circuit of the diode 107 and the n channel transistor 102 through the current mirror circuit consisted of the p channel transistors 104~106, and the bias circuit is constructed so as to make the current to be a bias current to the analog circuit.

In the above mentioned construction, the operation as a bias circuit is the same as the conventional example. Also, despite of the fluctuation of the power-supply voltage, the diode 107 having the CMOS structure functions in the same manner as the conventional n channel transistor 101, so that the fluctuation of the bias current is restrained to the same extent as the conventional extent regardless of the fluctuation of the power-supply voltage. On the other hand, with respect to the temperature fluctuation, the temperature characteristics of the n channel transistors 102 and 103 are counterbalanced, providing only the temperature characteristic of the diode 107. The temperature characteristic of the diode becomes small, about 2 mV/°C. which is smaller than the temperature characteristic of the n channel transistor by about one place of figure, so that the temperature characteristic of the drain current of the n channel transistor 103 is improved, and the temperature characteristic of the bias current to the analog circuit is also improved. As a result, the temperature dependence of the analog circuit characteristic can be decreased widely.

In the above description, although the present invention is applied to a microcomputer of non-contact IC card, it can also be applied to various microcomputers if they have semiconductor integrated circuits including analog circuits with MOS structure.

As mentioned above, according to the present invention, the semiconductor integrated circuit with MOS structure comprises the analog circuit and the bias circuit generating the bias current to be flowed to said analog circuit, in which the first and second island in the MOS structure are used as the diode in said bias circuit, the first transistor which connects the gate and drain and the diode are connected in series, the voltage generated by this serial circuit is applied to the gate of the second transistor for setting the current value, the constant current generated in the second transistor is fed back to the serial circuit of the diode and the first transistor through the current mirror circuit and is made to be the bias current to the analog circuit. Therefore, the fluctuation of the characteristic of the analog circuit can be restrained despite of the fluctuation of not only the power-supply voltage but also the fluctuation of the temperature.

What is claimed is:

1. A semiconductor integrated circuit with MOS structure, comprising:
    an analog circuit; and
    a bias circuit, coupled to said analog circuit, for supplying a bias current to said analog circuit, said bias circuit comprising:
    a diode formed of first and second islands having opposite types of conductivity in the MOS structure,
    a first transistor having its gate and drain coupled together, said first transistor, coupled to said diode in series to form a serial circuit, for providing a voltage, a second transistor, having its gate coupled to said serial circuit, for generating a constant current in response to said voltage, and current mirror means, coupled to said second transistor and responsive to said constant current, for feeding back said constant current to said serial circuit and for supplying said constant current as said bias current to said analog circuit.

2. The semiconductor integrated circuit according to claim 1 wherein the integrated circuit is part of a microcomputer having CMOS structure and forming a non-contact IC card.

3. The semiconductor integrated circuit according to claim 1 or 2, wherein said first and second transistors are n-channel MOS transistors and said current mirror means comprises p-channel MOS transistors.

4. The semiconductor integrated circuit according to claim 3, wherein an anode of said diode is coupled to a source of said first transistor, and a cathode of said diode is grounded.

5. The semiconductor integrated circuit according to claim 4, wherein said first island of said diode is of an n conductivity type and is formed in a substrate of a p conductivity type which is at ground level in an IC having CMOS structure, and wherein said second island of said diode is of a p conductivity type and is formed in said first island, whereby said diode is constructed with said island being the cathode and said second island being the anode.

6. A bias circuit with MOS structure for supplying a bias current to an analog circuit, said bias circuit comprising:

a diode formed of first and second islands having opposite types of conductivity in the MOS structure;

a first transistor having its gate and drain coupled together, said first transistor, coupled to said diode in series to form a serial circuit, for providing a voltage;

a second transistor having its gate coupled to said serial circuit for generating a constant current in response to said voltage; and current mirror means, coupled to said second transistor and responsive to said constant current, for feeding back said constant current to said serial circuit and for supplying said constant current as said bias current to said analog circuit.

7. The bias circuit according to claim 6 wherein the circuit is part of a microcomputer having CMOS structure and forming a non-contact IC card.

8. The bias circuit according to claim 6 or 7 wherein said first and second transistors are n-channel MOS transistors and said current mirror means comprises p-channel MOS transistors.

9. The bias circuit according to claim 8 wherein an anode of said diode is coupled to a source of said first transistor, and a cathode of said diode is grounded.

10. The bias circuit according to claim 9 wherein said first island is of an n conductivity type and is formed in a substrate of a p conductivity type which is at ground level in an IC having CMOS structure, and wherein said second island of said diode is of a p conductivity type and is formed in said first island, and whereby said diode is constructed with said island being the cathode and said second island being the anode.

* * * * *